(12) United States Patent
Broeckmann et al.

(10) Patent No.: US 11,175,348 B2
(45) Date of Patent: Nov. 16, 2021

(54) METHOD AND DEVICE FOR IDENTIFYING ARC FAULTS IN AN UNGROUNDED POWER SUPPLY SYSTEM

(71) Applicant: Bender GmbH & Co. KG, Gruenberg (DE)

(72) Inventors: Eckhard Broeckmann, Giessen (DE); Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 246 days.

(21) Appl. No.: 15/588,860

(22) Filed: May 8, 2017

(65) Prior Publication Data

US 2017/0328944 A1 Nov. 16, 2017

(30) Foreign Application Priority Data

May 13, 2016 (DE) ...................... 10 2016 208 322.8

(51) Int. Cl.
*G01R 31/08* (2020.01)
*G01R 23/16* (2006.01)
(Continued)

(52) U.S. Cl.
CPC ........... *G01R 31/52* (2020.01); *G01R 31/083* (2013.01); *G01R 23/16* (2013.01); *G01R 31/1272* (2013.01); *H02H 1/0015* (2013.01)

(58) Field of Classification Search
None
See application file for complete search history.

(56) References Cited

U.S. PATENT DOCUMENTS 4,878,142 A * 10/1989 Bergman ............... G01R 31/50
361/80
5,537,327 A * 7/1996 Snow ..................... G01R 31/50
700/293
(Continued)

FOREIGN PATENT DOCUMENTS

CN 101452038 A 6/2009
CN 102854426 A 1/2013
(Continued)

OTHER PUBLICATIONS

Ian A. Finneran et al.; A Direct Digital Synthesis Chirped Pulse Fourier Transform Microwave Spectrometer; Review of Scientific Instruments; Aug. 1, 2013.

(Continued)

*Primary Examiner* — Lisa E Peters
(74) *Attorney, Agent, or Firm* — Dickinson Wright PLLC; Andrew D. Dorisio

(57) ABSTRACT

The invention relates to a method and a device for identifying arc faults in an ungrounded power supply system. This object is attained by detecting a displacement voltage to ground at an active conductor or at a neutral point of the ungrounded power supply system; by providing a value of an operating frequency occurring in the power supply system; and by analyzing a frequency spectrum of the detected displacement voltage by calculating and assessing Fourier coefficients at the locations of the operating frequency and its harmonics. Due to the broadband detection of the displacement voltage interacting with the "quick" generation of the basic functions by means of a DDS generator, arc faults can be identified reliably in an ungrounded power supply system.

9 Claims, 3 Drawing Sheets

Figure 1:
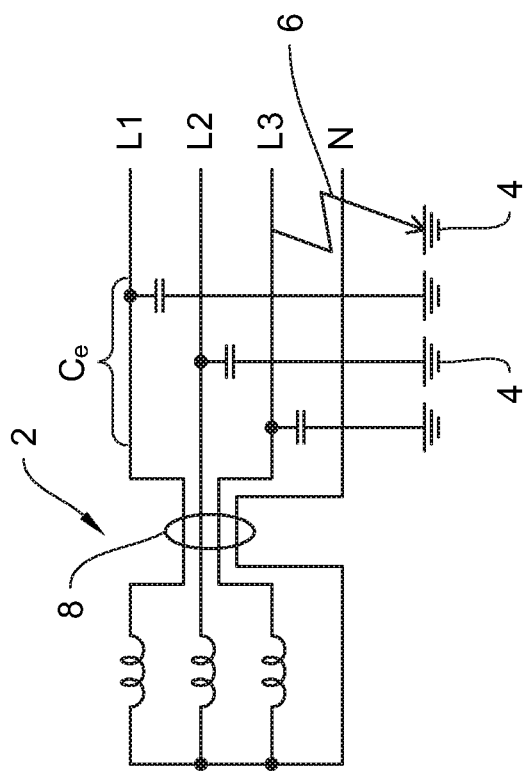

(51) Int. Cl.
  *G01R 31/52* (2020.01)
  *H02H 1/00* (2006.01)
  *G01R 31/12* (2020.01)

(56) References Cited

U.S. PATENT DOCUMENTS

| | | | |
|---|---|---|---|
| 5,602,709 A | 2/1997 | Al-Dabbagh | |
| 6,242,922 B1* | 6/2001 | Daum | H02H 1/0015 324/520 |
| 6,628,487 B1* | 9/2003 | Macbeth | H02H 1/0015 361/42 |
| 9,366,716 B2* | 6/2016 | Zach | G01R 31/12 |
| 2004/0141265 A1* | 7/2004 | Angle | H02H 3/338 361/44 |
| 2008/0077336 A1* | 3/2008 | Fernandes | G01R 15/142 702/57 |
| 2008/0084215 A1* | 4/2008 | Itten | G01R 27/18 324/510 |
| 2012/0176712 A1 | 7/2012 | Kim | |
| 2012/0182038 A1* | 7/2012 | Marzetta | G01R 31/086 324/764.01 |
| 2013/0226479 A1* | 8/2013 | Grosjean | H02H 1/0015 702/58 |
| 2014/0114591 A1* | 4/2014 | Broeckmann | G01R 31/1272 702/58 |
| 2014/0168843 A1* | 6/2014 | Privitera | G01R 31/025 361/93.1 |
| 2014/0347069 A1* | 11/2014 | Krumpholz | G01R 31/025 324/541 |
| 2015/0168473 A1* | 6/2015 | Fornage | G01R 31/025 324/509 |
| 2016/0091554 A1* | 3/2016 | Fornage | G01R 27/18 324/509 |
| 2016/0266208 A1* | 9/2016 | Athikessavan | H02P 29/0241 |
| 2018/0203056 A1* | 7/2018 | Dzienis | G01R 19/165 |

FOREIGN PATENT DOCUMENTS

| | | |
|---|---|---|
| CN | 103457238 A | 12/2013 |
| CN | 103869226 A | 6/2014 |
| CN | 1040625555 | 9/2014 |
| CN | 104237737 A | 12/2014 |
| CN | 105223469 A | 1/2016 |
| DE | 2002777 A1 | 8/1971 |
| DE | 19633527 A1 | 2/1998 |
| DE | 69414328 | 6/1999 |
| EP | 2040348 A2 | 3/2009 |
| EP | 2717063 A1 | 4/2014 |
| EP | 2777581 A1 | 9/2014 |
| EP | 2778703 A2 | 9/2014 |
| EP | 2919026 A1 | 9/2015 |
| EP | 3089299 A1 | 11/2016 |
| EP | 3121610 A1 | 1/2017 |
| KR | 101341107 | 1/2014 |
| WO | 2005038474 A1 | 4/2005 |
| WO | 2009121382 A1 | 10/2009 |
| WO | 2013081310 A1 | 6/2013 |

OTHER PUBLICATIONS

Zhao Dongsheng et al.; Design and Implementation of Conducted Emission Reference Source; 2014 IEEE International Symposium on Electromagnetic Compatibility; Aug. 4, 2014.

English Machine Translation of WO2009121382A1 dated Oct. 8, 2009.

* cited by examiner (State of the art)

METHOD AND DEVICE FOR IDENTIFYING ARC FAULTS IN AN UNGROUNDED POWER SUPPLY SYSTEM

This application claims the benefit of German Patent Application no. 10 2016 208 322.8, filed May 13, 2016, the disclosure of which is incorporated herein by reference.

TECHNICAL FIELD

The invention relates to a method and a device for identifying arc faults in an ungrounded power supply system.

BACKGROUND

Arc faults appear as an unintended electric discharge in gases between conductive parts in electric installations, for example as a consequence of inappropriate installations or as a consequence of damaged wire insulations. The increase in temperature arising at the defective location can pose a real fire hazard in conjunction with flammable materials.

Prematurely identifying such arc faults or arc flashes is therefore absolutely imperative in order to prevent further damage to the electric installation and preclude a fire hazard.

General requirements for arc-fault detection devices (AFDD) are specified in the standard DIN EN 62606 (VDE 0665-10)/IEC 62606:2013. Requirements and inspection specifications for photovoltaic DC arc-fault circuit interrupters (AFCI) are set out in the American testing standard UL 1699B, said AFCIs being put to use mainly in the American market.

The theory of operation of these detection devices and circuit interrupters is based mostly on the frequency-selective assessment of displacement currents and/or load currents. In this grid-bound identification of arc faults, the current is detected on the conductor to be monitored by means of a current sensor (measuring current transformer) and evaluated using methods of digital signal processing in the spectral range. Characteristic spectral progresses of the detected current, which occur when igniting an electric arc, can be identified in this manner.

However, reliably identifying an electric arc requires quite sophisticated signal-processing algorithms since characteristic spectral patterns, which are related to generating an electric arc, in normal operational noise spectrums of the detected current are hidden. In particular if further electric components, such as frequency converters, comprising a fairly broadband interference source are installed in the power supply system, identifying the electric arc becomes difficult.

A method and an arrangement for identifying electric arcs is described in EP 2 040 348 A2, said method and said arrangement being based on the described identification of a conductor current having a current sensor and a subsequent digital frequency analysis. The levels of the direct current component and individual harmonics are calculated and assessed by means of a Fourier transform. For this purpose, the power frequency serves as a reference frequency for the sampling rate of the digital circuit generated from a phase-locked loop (PLL) in an alternating current system. This sampling rate is always an integer multiple of the power frequency and can continuously change when the power frequency drifts.

Furthermore, the range of the operating frequency, which can be adjusted using the PLL, is limited so that generating higher harmonics of the operating frequency does not seem doable. Moreover, the PLL control is connected to inertia so that the dynamic behavior in quick frequency changes remains inadequate.

Another disadvantage of the methods described above for identifying arc faults is the narrowband transmitting function of the measuring current transformer since current sensors having ferromagnetic cores in particular do not operate under broadband conditions due to the operating principle. Insofar, the spectral analysis based on the detected current signal is also bandlimited and spectral components, which have a higher frequency and could lead to a more reliable decision regarding the occurrence of an electric arc, must remain disregarded.

Bearing in mind the effects of occurring electric arcs when harmonics of the operating frequency are higher, for example ranging into the frequency of 110 kHz ($11^{th}$ harmonic of an operating frequency of 10 kHz), is sensible in conjunction with the operation of converters, whose typical operating frequencies (converter switching frequency) are in the range of approximately 10 kHz.

Due to the fairly common use of grounded power supply systems, the features of grounded power supply systems in particular have been borne in mind when developing and implementing arc fault detection devices. The special features of ungrounded power supply systems and the resulting possibilities have so far not been used.

The ungrounded power supply system—also known as an insulated network (from French isolé terre) or IT power supply system—is characterized in that the active parts are separated from the ground potential, with respect to ground. The advantage of these networks is that the function of the connected electric operating means is not inhibited when a first insulation fault, such as a ground fault or a fault to frame, occurs since a closed electric circuit cannot be realized in this first fault instance because of the ideally infinitely large impedance value between the active conductor (phases and neutral conductor) of the network and the ground, meaning that the ungrounded power supply system remains functional even at a first occurring fault.

The object of the invention at hand therefore is to make identifying arc faults in ungrounded power supply systems, in particular in ungrounded power supply systems comprising a frequency converter, more reliable as opposed to the methods known from the state of the art.

SUMMARY

This object is attained by a method, which comprises the following method steps: detecting a displacement voltage to ground at an active conductor or at a neutral point of the ungrounded power supply system; providing a value of an operating frequency occurring in the power supply system; and analyzing a frequency spectrum of the detected displacement voltage by calculating and assessing the Fourier coefficients at the locations of the operating frequency and its harmonics.

In contrast to grounded power supply systems, the possibility of detecting the voltage to ground at an active conductor or a neutral point as a displacement voltage in a first occurring fault instance exists in ungrounded power supply systems.

A "simple" low-impedance insulation fault of a conductor to ground (ground fault) does not lead to a notable current flow in an ungrounded power supply system. Thus, the electric potential of the faulty conductor is nearly that of the ground potential. Should, however, the low-impedance insulation fault of the conductor to ground be caused by an electric arc, a nonnegligible current flow via the electric arc resistance can be presumed. In this case, a decrease in (displacement) voltage can arise at the electric arc resistance. The frequency components typical to an electric arc are contained in this displacement voltage signal.

In contrast to the bandlimited detection of the current signal, the displacement voltage signal is detected very broadbandedly and thus provides the foundation for a reliable decision on whether an arc fault occurred or not.

The frequency spectrum of the detected displacement current is analyzed by calculating and assessing Fourier coefficients at the locations of the operating frequency and its harmonics over a wide frequency range.

For this purpose, the value of an operating frequency occurring in the power supply system is provided. Providing the operating frequency is necessary for defining the basic frequency (first harmonic) of the orthogonal and harmonic basic function for calculating the Fourier coefficients.

Furthermore, the operating frequency is a network frequency (power frequency) of the power supply system and/or a converter switching frequency of a frequency converter.

In a pure AC system having no frequency converter, the operating frequency corresponds to the network frequency of the power supply system. Should a frequency converter be installed in the power supply system, for example in conjunction with a controlled electric drive, the operating frequency then corresponds to the converter switching frequency and frequency contents can occur at locations of the converter switching frequency and its higher harmonics as well as possibly a direct component in consequence of a DC voltage link circuit. The invention at hand is therefore equally suitable for use in ungrounded AC power supply systems and in ungrounded DC power supply systems, such as photo voltaic systems having inverters.

In another advantageous embodiment, orthogonal and harmonic basic functions are generated using the operating frequency and its harmonics by means of direct digital synthesis (DDS) for calculating the Fourier coefficients.

In particular in electric installations, which are operated using a frequency converter, it is necessary to quickly adjust the frequency locations to be observed in the spectral analysis to the present switching frequency of the frequency converter.

With respect to a PLL based control, the DDS generated signal (the harmonic basic functions having the operating frequency and its harmonics) comprise the advantage of a better dynamic behavior.

Thus, the generated orthogonal and harmonic basic functions can very quickly succeed a change in frequency of the operating frequency and that with a continuous progression. The reaction to a sudden change in frequency is even possible during a running integration period when calculating the Fourier coefficients, albeit connected to certain inaccuracies in measurement.

The purely numeric adjustment to the operating frequency via the DDS generation, in contrast to the solution based on control technique, moreover enables a broad spectral setting range.

By using the orthogonal and harmonic basic functions generated thus, the detected (time domain) values of the displacement voltage are subjected to a discrete Fourier transform in a known manner after being transformed into a time-discrete and value-discrete signal by sampling and quantizing.

Furthermore, it is decided that an arc fault has occurred if at least one normalized Fourier coefficient, in terms of magnitude, exceeds a threshold value allocated to the corresponding normalized Fourier coefficient according to amount.

The Fourier coefficients are available as complex-valued coefficients having real and imaginary parts. After magnitude calculation and normalization, a test is conducted on whether the respective normalized Fourier coefficient exceeds the respective threshold value in terms of magnitude.

Normalization is conducted by dividing the magnitude of the respective Fourier coefficient of the nth order by the magnitude of the Fourier coefficient of the first harmonic (operating frequency). Thus, an absolute calibration of the amplification of the entire system is not necessary and fluctuations of the amplification can be compensated.

Furthermore, the threshold values having a factor $1/n^2$ are assessed, wherein n is the order of the nth harmonic of the operating frequency.

By means of this measure, it is borne in mind on the one hand that the amplitude spectrum of an electric arc discharge can be approached by approximation via a 1/f feature which is similar to pink noise. On the other hand, the current signal is integrated via the network leakage capacitor. This integration corresponds to an additional weighting in the frequency range using 1/f so that a dependence of $1/n^2$ results when setting the threshold value while evaluating the displacement voltage, which was caused by the current flow.

Advantageously, results of an insulation resistance measurement are also included for detecting arc faults.

By evaluating an insulation resistance measurement in regard of a low-impedance or high-impedance insulation fault and/or a symmetric or asymmetric insulation fault, information on when an arc fault is likely to occur can be gathered on the basis of empirical values.

Furthermore, further system parameters are also included for detecting arc faults.

Further system parameters, such as mains voltage, network frequency or discharge capacity, are also borne in mind since they indirectly influence the detected displacement voltage.

The object of the invention is further attained by a device for detecting arc faults in an ungrounded power supply system, comprising: a voltage sensor for detecting a displacement voltage to ground at an active conductor or at a neutral point of the ungrounded power supply system; a frequency detection for providing a value of an operating frequency occurring in the power supply system; and an analyzing device for analyzing a frequency spectrum of the detected displacement voltage by calculating Fourier coefficients at the locations of the operating frequency and its harmonics.

As a voltage measuring device, the voltage sensor detects the voltage to ground at an active conductor or at the neutral point of the ungrounded power supply system (displacement voltage). In a frequency converter operation, this displacement voltage at an active conductor can be captured in close proximity to the frequency converter.

Igniting an electric arc causes a current flow which deviates from the normal operating state. This change in the current flow can be detected by measuring the displacement voltage in an ungrounded power supply system. In particular in installations having frequency converters, electric arc ignitions become apparent by periodic steps in the displacement voltage.

The frequency detection provides the value of the operating frequency, which is transmitted to the analysis device for generating the orthogonal and harmonic basic functions.

The frequency detection is configured such that when the operating frequency is changed, the new operating frequency is provided after exactly one period of the new operating frequency has been measured.

The operating frequency can be gathered from an analog signal, which is a representation of the voltage curve present on the network, by means of a frequency detection conducted as a frequency measuring device or already be available as a digital clock signal, which directly presents the operating frequency.

In the analysis device, the frequency-selective analysis of the frequency spectrum of the detected displacement voltage is conducted by calculating Fourier coefficients, comprising the generated orthogonal and harmonic basic functions, at the locations of the operating frequency and its harmonics.

Furthermore, the frequency detection is conducted in such a manner that the provided operating frequency is a network frequency of the power supply system and/or a converter switching frequency of a frequency converter.

The frequency detection must be capable of extracting the operating frequency contained in the supplied analog signal from said analog signal, which is a representation of the voltage curve available on the network, and of transmitting the extracted operating frequency to the successive analysis device. For this purpose, the determined operating frequency can range from 50/60 Hz or 400 Hz for network frequencies and suffice for dimensions of up to 10 kHz in converting operations.

In another embodiment, the device comprises a DDS generator (direct digital synthesis) for generating orthogonal and harmonic basic functions having the operating frequency and its harmonics for calculating the Fourier coefficients.

The basic concept of the DDS generator rests in a known manner upon a frequency being able to be described as a temporal change in phase. By accumulating phase increments, therefore, a certain frequency can be generated, the size of the phase increments (at a constant clock frequency of the generator) setting the frequency of the generated oscillations. A register is therefore a central functioning block of the DDS generator, said register adding up a predetermined phase increment in every clock cycle (phase accumulator). The read phase values serve for addressing a table, which allocates an amplitude value to the corresponding phase value and generates the desired form of oscillation—a sine table for generating the harmonic basic functions being at hand.

Besides the advantages described above for a quick adaptability to the determined operating frequency and a broad frequency setting range, the DDS generator also provides the advantage of a high frequency resolution (in dependence of the word width of the register and the clock frequency).

Furthermore, the device comprises a decider, which determines that an arc fault has occurred, should at least one normalized Fourier coefficient exceed a threshold value allocated to the corresponding Fourier coefficient.

In a comparison between the calculated normalized Fourier coefficients and their allocated threshold values, it is decided whether the threshold value has been exceeded and thus the triggering criteria fulfilled.

The device further comprises an assessment unit for assessing the threshold value having a factor of $1/n^2$, wherein n is the order of the nth harmonic of the operating frequency.

Assessing the threshold value having the factor of $1/n^2$ makes allowance for the fact that the spectrum caused by an electric arc can be approached as 1/f noise (pink noise) on the one hand and that the current signal is integrated via the network leakage capacitors on the other hand, said integration corresponding to a further 1/f evaluation in the spectral range.

Furthermore, the decider comprises an evaluation device, which also bears the results of an insulation resistance measurement and/or further system parameters for detecting arc faults in mind.

The results from the insulation resistance measurement as well as the further system parameters can thus be merged and can increase the probability of detecting an arc fault in a common evaluation in conjunction with the spectral analysis of the displacement voltage. Thus, the decision whether an electric arc has occurred can be made much more reliably in conjunction with a symmetric or an asymmetric insulation fault being available or in dependence of a measured network leakage capacitor.

BRIEF DESCRIPTION OF THE DRAWING FIGURES

Figure 2:
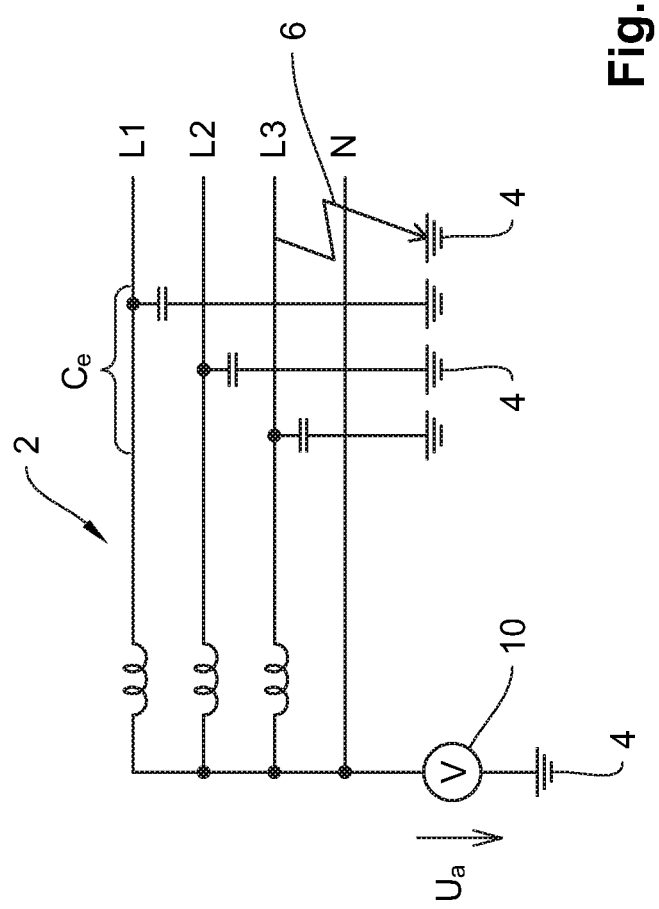
Figure 3:
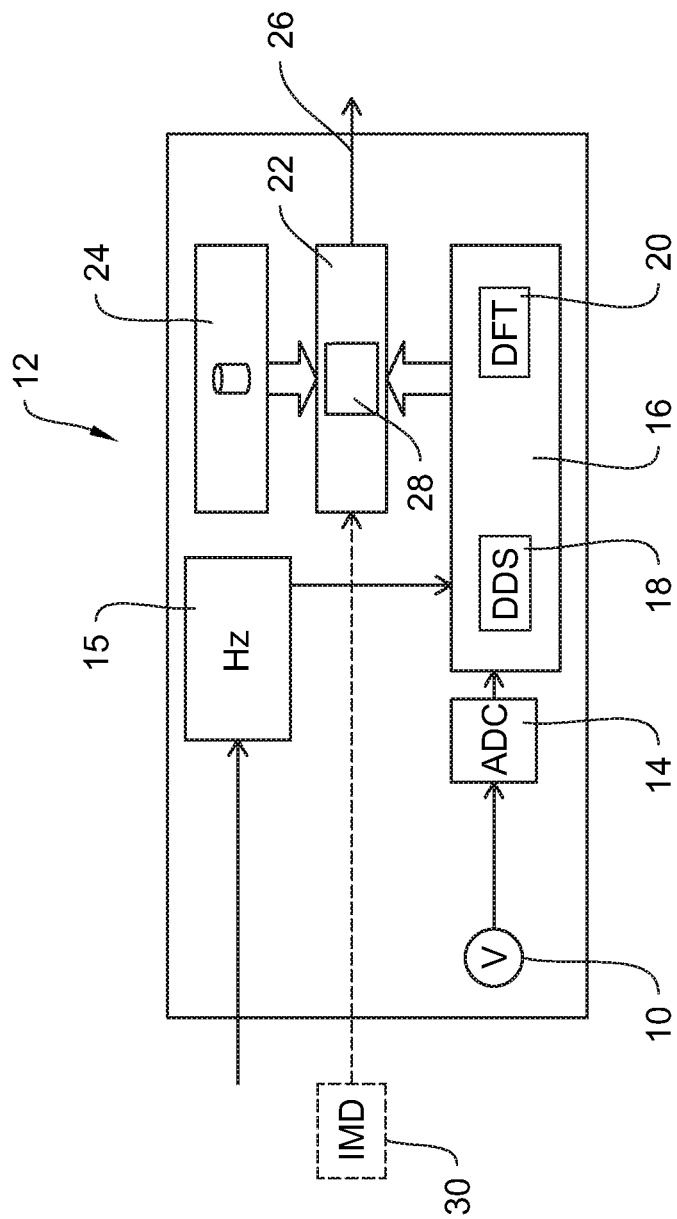

Further advantageous embodiments can be taken from the description and the drawing, which shows a preferred embodiment of the invention by way of example. In the figures, FIG. 1 shows an arc fault detection in an ungrounded power supply system according to the state of the art, FIG. 2 shows an arc fault detection in an ungrounded power supply system according to the invention, FIG. 3 shows a device according to the invention for detecting arc faults in an ungrounded power supply system.

DETAILED DESCRIPTION

FIG. 1 shows an arc fault detection in an ungrounded power supply system 2 according to the state of the art in a schematic view. The ungrounded power supply system 2 is set up as a three-phase network comprising the active conductors L1, L2, L3 (phase conductors) and N (neutral conductor) in an exemplary manner. As a particular feature of the ungrounded power supply system 2, all active parts of the power supply system are separated with respect to ground 4 so that a closed circuit cannot arise in a first fault instance because of the ideally infinitely large impedance value between the active conductors L1, L2, L3, N of the power supply system 2 to ground 4 when the first insulation fault occurs. In reality, an extremely low leakage current flows, whose size (in AC systems) at first is determined by the network leakage capacitors Ce.

Igniting an electric arc 6, for example between the conductor L3 and ground 4, causes a typical impulse-shaped change of the conducting current, said change being identifiable as an interfering event using a current sensor 8 (measuring current transformer, summation current transformer). This interference is superposed by the leakage currents (provided that they do not cancel each other out in three-phase power systems) when measuring the summation current. Moreover, the current sensor 8 comprises only a limited transmission bandwidth. Even using the sophisticated methods for digital signal processing in the spectral range, interferences caused by the electric arc 6 can still not be detected reliably.

In FIG. 2, an arc fault detection according to the invention in an ungrounded power supply system is shown in a schematic view. Due to the specific feature of the ungrounded power supply system 2, a displacement voltage Ua can be measured using a voltage sensor 10. In the example shown, the displacement voltage Ua is detected at the neutral point of the power supply system. The insulation fault which arose from the electric arc 6 igniting is connected to a current flow over the electric arc resistance. The current flow leads to a decrease in voltage along the electric arc resistance, said decrease in voltage being able to be measured as the displacement voltage Ua.

Contrary to detecting the current using a bandlimited current sensor 8, the (displacement) voltage Ua can be advantageously detected very broadbandedly using a voltage sensor 10 constructed as a voltage measuring device. This in turn enables also including higher harmonics of the operating frequency in the spectral analysis and to thus receive a reliable arc fault detection.

The orthogonal and harmonic basic functions can be generated by the DDS generator 18, said generation being required for the spectral transform of the displacement-voltage time signal (FIG. 3).

In a functional block diagram, FIG. 3 shows a device 12 according to the invention for detecting arc faults in an ungrounded power supply system 2.

The device 12 comprises the voltage sensor 10 at its input, said voltage sensor 10 detecting the displacement voltage Ua in the power supply system 2 and forwarding it to an AD converter 14. The series of the sampled and quantized values of the displacement voltage Ua go from the outlet of the AD converter 14 into an analysis device 16, in which these values are subjected to a spectral analysis by means of a discrete Fourier transform.

A frequency detection 15 conducted as a frequency measuring device determines the value of the operating frequency from an analog signal, which shows a representation of the voltage curve available on the power supply system 2, and forwards this value to the analysis device 16. The analysis device 16 comprises the DDS generator 18 and a DFT block 20 as essential functional units.

The DDS generator 18 generates orthogonal and harmonic basic functions using the known operating frequency and its harmonics. These basic functions are used in the DFT block 20 for calculating the Fourier coefficients.

In a decider 22, the calculated and normalized Fourier coefficients are compared to the weighted threshold values allocate thereto and deposited in a memory 24. The decider 22 can further comprise an evaluating unit 28, which also includes the results from an insulation fault measurement and/or further system parameters. The results of the insulation fault measurement and/or the further network parameters can be provided by an insulation monitoring device (IMD) 30.

Should a triggering criteria be fulfilled, an alarm signal 26 is sent out, which signals an occurring electric arc 6.

By the broadbanded detection of the displacement voltage interacting with the "quick" generation of the basic functions by means of the DDS generator, arc faults can be reliably detected in an ungrounded power supply system.

The invention claimed is:

1. A method for identifying arc faults in an ungrounded power supply system, comprising the method steps:

detecting a displacement voltage to ground at an active conductor or at a neutral point of the ungrounded power supply system obtaining a value of an operating frequency occurring in the ungrounded power supply system by a frequency detector and providing the value to an analyzing device, analyzing a frequency spectrum of the detected displacement voltage by calculating and assessing Fourier coefficients at a frequency the location of the operating frequency and at frequency locations of harmonics of the operating frequency, using results of an insulation resistance measurement for identifying faults and;

deciding that an arc fault has occurred, should at least one normalized Fourier coefficient, in terms of magnitude, exceed an allocated threshold value which corresponds to the at least one normalized Fourier coefficient.

2. The method according to claim 1, characterized in that the operating frequency is a power frequency of the ungrounded power supply system and/or a converter switching frequency of a frequency converter.

3. The method according to claim 1, characterized by generating orthogonal and harmonic basic functions using the operating frequency and its harmonics by means of direct digital synthesis (DDS) for calculating the Fourier coefficients.

4. The method according to claim 1, characterized in that the threshold values are assessed using a factor of $1/n^2$, wherein n is the order of the nth harmonic of the operating frequency.

5. The method according to claim 1, characterized in that further system parameters are used for identifying arc faults.

6. A device for identifying arc faults in an ungrounded power supply system, comprising: a voltage sensor for detecting a displacement voltage to ground at an active conductor or at a neutral point of the ungrounded power supply system; a frequency detector for providing a value of an operating frequency occurring in the ungrounded power supply system to an analyzing device; the analyzing device, comprising an DDS generator and a DFT block, for analyzing a frequency spectrum of the detected displacement voltage by calculating Fourier coefficients at a frequency location of the operating frequency and at frequency locations of harmonics of the operating frequency; a decider, configured to determine that an arc fault has occurred, should a normalized Fourier coefficient exceed an allocated threshold value which corresponds to the at least one normalized Fourier coefficient, said decider comprising an evaluation device, said evaluation device using results of an insulation resistance measurement by evaluating an insulation resistant measurement in regard of a low impedance or high impedance insulation fault and/or further system parameters in a common evaluation in conjunction with a spectrum analysis of the displacement voltage.

7. The device according to claim 6, characterized in that the frequency detector is realized in such a manner that the provided operating frequency is a power frequency of the ungrounded power supply system and/or a converter switching frequency of a frequency converter.

8. The device according to claim 6, characterized by the DDS generator (direct digital synthesis) generates orthogonal and harmonic basic functions using the operating frequency and its harmonics for calculating the Fourier coefficients.

9. The device according to claim 6, characterized by an assessing unit for assessing the threshold value having a factor of $1/n2$, wherein n is the order of the nth harmonic of the operating frequency.

* * * * *